(12) United States Patent
Tsai

(10) Patent No.: US 7,497,743 B2
(45) Date of Patent: Mar. 3, 2009

(54) ELECTRICAL CONNECTOR HAVING ELASTIC ARMS OF TERMINALS EXTENDING SLANTINGLY UPWARDS

(76) Inventor: Chou Hsuan Tsai, 15F, No. 4, Lane 127, Sec. 1, Fu-Hsing Rd., Hsin-Chuang City, Taipei Hsien (TW)

( * ) Notice: Subject to any disclaimer, the term of this patent is extended or adjusted under 35 U.S.C. 154(b) by 23 days.

(21) Appl. No.: 11/888,551

(22) Filed: Jul. 31, 2007

(65) Prior Publication Data

US 2008/0032532 A1    Feb. 7, 2008

(51) Int. Cl.
*H01R 4/48* (2006.01)
(52) U.S. Cl. ..................................... 439/862
(58) Field of Classification Search ................ 439/160, 439/884, 885, 889, 816, 66, 331, 73, 862, 439/632, 83
See application file for complete search history.

(56) References Cited

U.S. PATENT DOCUMENTS 6,652,329 B1 * 11/2003 Howell et al. ............... 439/862
6,971,902 B2 * 12/2005 Taylor et al. ................ 439/342
7,297,010 B2 * 11/2007 Tsai ............................ 439/331

* cited by examiner

*Primary Examiner*—Edwin A. Leon
(74) *Attorney, Agent, or Firm*—Pro-Techtor Int'l Services

(57) ABSTRACT

An electrical connector includes terminals and a base formed with terminal slots each having opposite first walls and second walls. Pressing a metal plate forms a material tape and the continuous terminals connected thereto. Each terminal, assembled within the corresponding slot and then separated from the tape, has a cut surface, a plate surface, a fixing portion, an elastic arm and a pin portion. The fixing portion has a plate surface close to the first wall. The arm is connected to the fixing portion and has a plate surface, which extends longitudinally and slantingly upwards in a direction toward one side of the fixing portion and extends across the second wall to a location above the neighboring terminal slot. A connection point near a distal end of the arm is formed, and the pin portion disposed below the fixing portion extends downwards to a bottom end of the base.

15 Claims, 12 Drawing Sheets

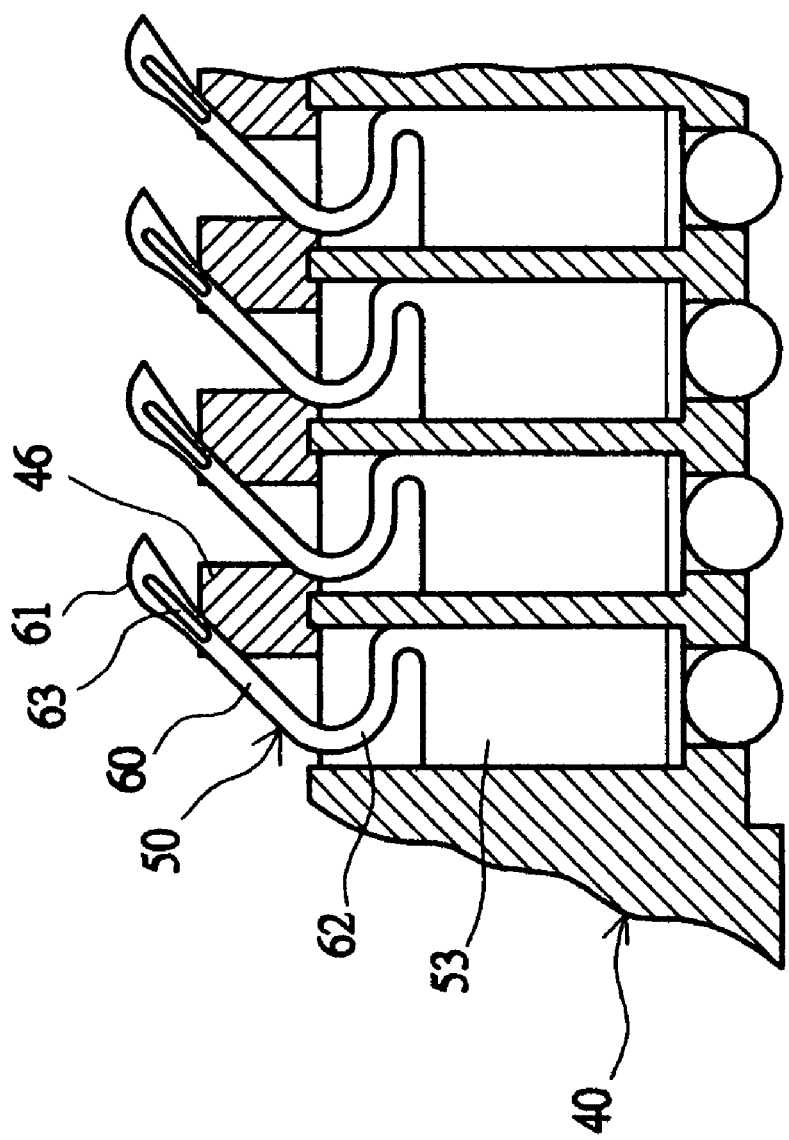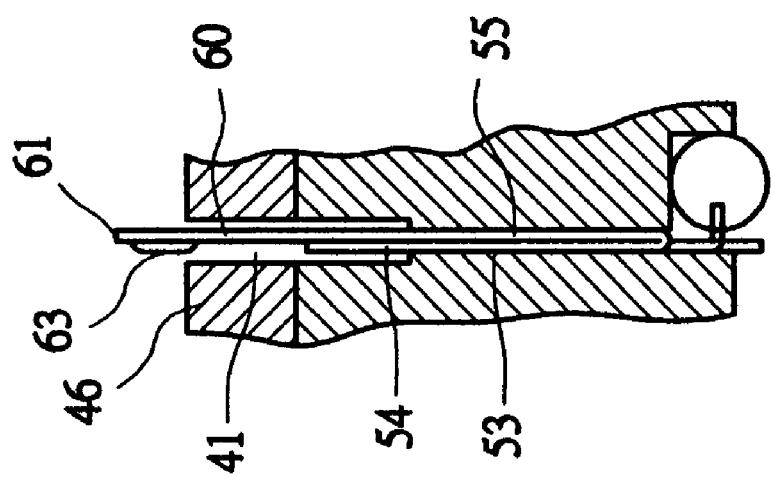
FIG. 13
FIG. 14

ELECTRICAL CONNECTOR HAVING ELASTIC ARMS OF TERMINALS EXTENDING SLANTINGLY UPWARDS

BACKGROUND OF THE INVENTION

1. Field of Invention

The invention relates to an electrical connector having elastic arms of terminals extending slantingly upwards, and more particularly to an electrical connector having terminals that can be moved elastically and vertically.

2. Related Art

A bottom surface of a chip (e.g., a CPU) is formed with many connection points, and an electrical connector to be connected to this type of chip provides a downward pressing force to fix the chip onto a base so that the connection points of the chip are in elastic contact with terminals disposed in terminal slots of the base and the electrical connections therebetween can be ensured.

Referring to FIG. 1, an electrical connector to be connected to a chip includes a base 10 and terminals 14. The base 10 is formed with terminal slots 11. The terminals 14 are respectively disposed in the terminal slots 11 of the base. Each terminal 14 has a fixing portion 16 and an elastic arm 15 that can be moved elastically and vertically. The fixing portion 16 is tightly pressed against the terminal slot 11. The elastic arm 15 is connected to a top end of the fixing portion 16, and a projecting connection point 17 is formed near a distal end of the elastic arm 15.

When the chip 90 is placed on the base 10, each connection point 91 of the chip 90 contacts the connection point 17 of each terminal 14. As shown in FIG. 2, when the chip 90 is pressed down, each terminal 12 retracts due to the elasticity of the elastic arm 15. At this time, the connection point 17 tightly presses against the connection point 91 elastically to achieve the electrical connection effect.

The prior art has the following drawbacks. Each terminal slot 11 has a rectangular shape and is arranged on the base 10, and the terminal 14 is disposed in the terminal slot 11. The elastic arm 15 of the terminal 14 cannot have the unlimited extending length but only has the longest extending length equal to the length of the terminal slot 11. So, the elasticity of the elastic arm cannot reach the best state. More particularly, when the function of the CPU is getting more and more powerful, the connection points thereof are getting more and more. Thus, the base 10 has to be formed with more terminal slots 11 so that the length of the terminal slot is reduced. Thus, the extending length of the elastic arm 15 of the terminal 14 is also decreased so that the elasticity thereof is poor and the fatigue of elasticity tends to occur.

SUMMARY OF THE INVENTION

It is therefore an object of the invention to provide an electrical connector having elastic arms of terminals, wherein one of the elastic arms can extend toward one side of a fixing portion of the terminal to a location above a neighboring terminal slot so that the elastic contact of the terminal is better.

Another object of the invention is to provide an electrical connector having elastic arms of terminals each extending toward one side of a fixing portion of the terminal so that the terminal can be easily manufactured and occupy the smaller space of a terminal slot when it is being assembled.

Still another object of the invention is to provide an electrical connector, wherein a longitudinally extended arc portion is formed near a connection portion between an elastic arm of a terminal and a fixing portion of the terminal so that the good elasticity can be obtained according to the longitudinally extended arc portion when terminal slots are denser such that the lateral length of each terminal slot is shorter.

Yet still another object of the invention is to provide an electrical connector, wherein a connection point of an elastic arm of a terminal is formed by folding two plate surfaces together so that the connection point has a circular arc surface but not a cut surface.

Yet still another object of the invention is to provide an electrical connector, wherein a first wall of a base is formed with a projection disposed near an elastic arm of a terminal, and the projection can indeed position a connection point of the terminal to prevent the terminal from shaking so that the electrical contact is correct and stable.

Yet still another object of the invention is to provide an electrical connector, wherein a rib is formed near a connection point of an elastic arm of a terminal so that the portion of the terminal close to the connection point has the larger thickness and the electrical contact is correct and stable.

The invention achieves the above-identified objects by providing an electrical connector including a base and terminals. The base is formed with terminal slots each having two opposite first walls and two opposite second walls. Pressing a metal plate can form a material tape and the continuous terminals connected to the material tape. Each terminal is assembled within a corresponding one of the terminal slots and then separated from the material tape. Each terminal has a cut surface and a plate surface and comprises a fixing portion, an elastic arm and a pin portion. The fixing portion has a plate surface close to the first wall for positioning. The elastic arm is connected to the fixing portion and has a plate surface, which extends longitudinally and slantingly upwards in a direction toward one side of the fixing portion and extends across the second wall to a location above a neighboring one of the terminal slots. A connection point near a distal end of the elastic arm is formed, and the pin portion is disposed below the fixing portion and extends downwards to a bottom end of the base.

According to the structure mentioned hereinabove, the contact elasticity of the elastic arm of the terminal is better, the terminal can be easily manufactured, and the terminal occupies a smaller space of the terminal slot when it is being assembled.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 13 is a front cross-sectional assembled view showing terminals and an internal seat according to a fourth embodiment of the invention.

FIG. 14 is a lateral cross-sectional assembled view showing the terminals and the internal seat according to the fourth embodiment of the invention.

DETAILED DESCRIPTION OF THE INVENTION

The present invention will be apparent from the following detailed description, which proceeds with reference to the accompanying drawings, wherein the same references relate to the same elements.

Referring to FIGS. 3 to 6, an electrical connector according to a first embodiment of the invention includes a base, terminals 50, an upper cover 70 and a lever 80.

Figure 6:
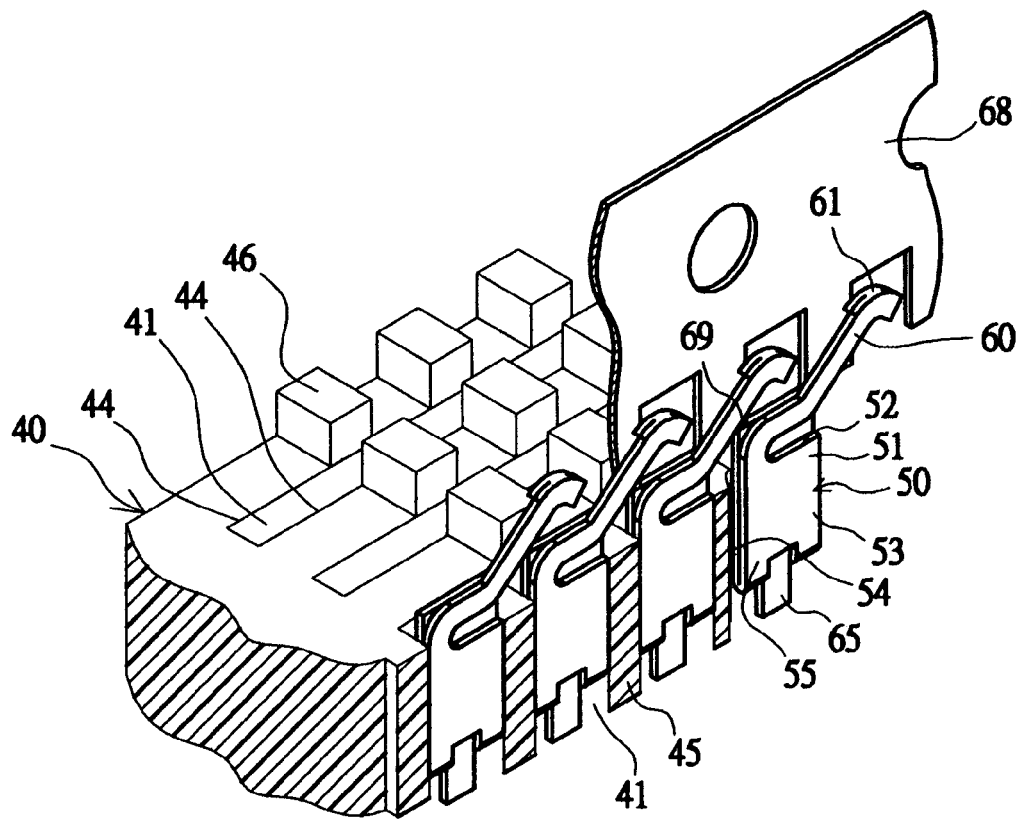
FIG. 6 is a pictorially assembled view showing terminals and an internal seat according to the first embodiment of the invention.
Figure 7:
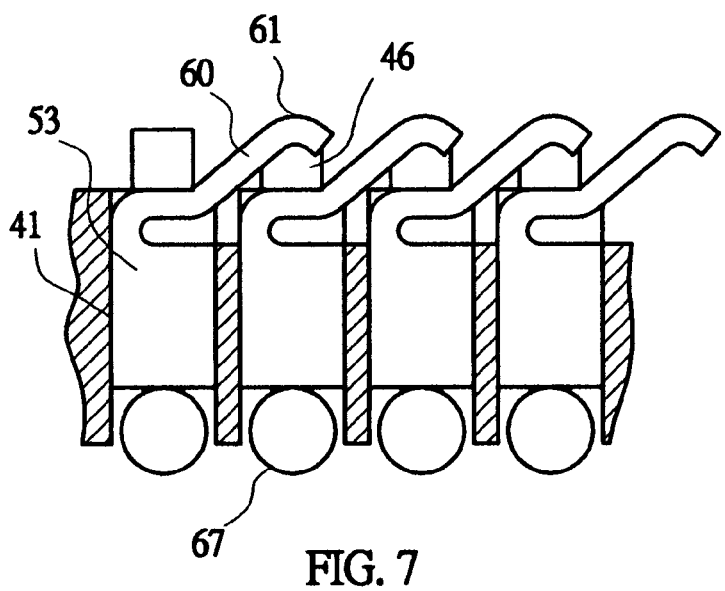
FIG. 7 is a front cross-sectional assembled view showing the terminals and the internal seat according to the first embodiment of the invention.
Figure 8:
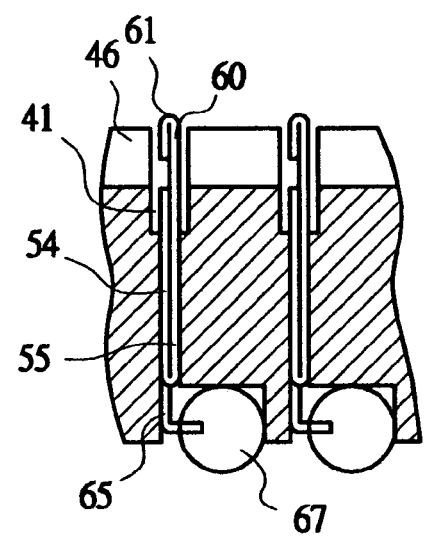
FIG. 8 is a lateral cross-sectional assembled view showing the terminals and the internal seat according to the first embodiment of the invention.

The base includes a metallic external seat 30 and a plastic internal seat 40. The external seat 30 has a bottom surface 31 and two sidewalls 32. A through hole 33 is formed at a central portion of the bottom surface 31. The external seat 30 has a front end formed with a first pivoting portion 34, a rear end formed with a hole-like second pivoting portion 35, and one side formed with an engaging piece 36. The internal seat 40 is fit within the external seat 30 and is formed with terminal slots 41. A circumference on a top end of the internal seat 40 is formed with a flange 42 enclosing a placement area 43 in which a chip 90 is placed. As shown in FIGS. 6 to 8, each terminal slot 41 has two opposite first walls 44 and two opposite second walls 45, wherein the first wall 44 is higher than the second wall 45 and is formed with a projection 46. In addition, the terminal slot 41 has an upper portion that is wider and a lower portion that is narrower.

Figure 9:
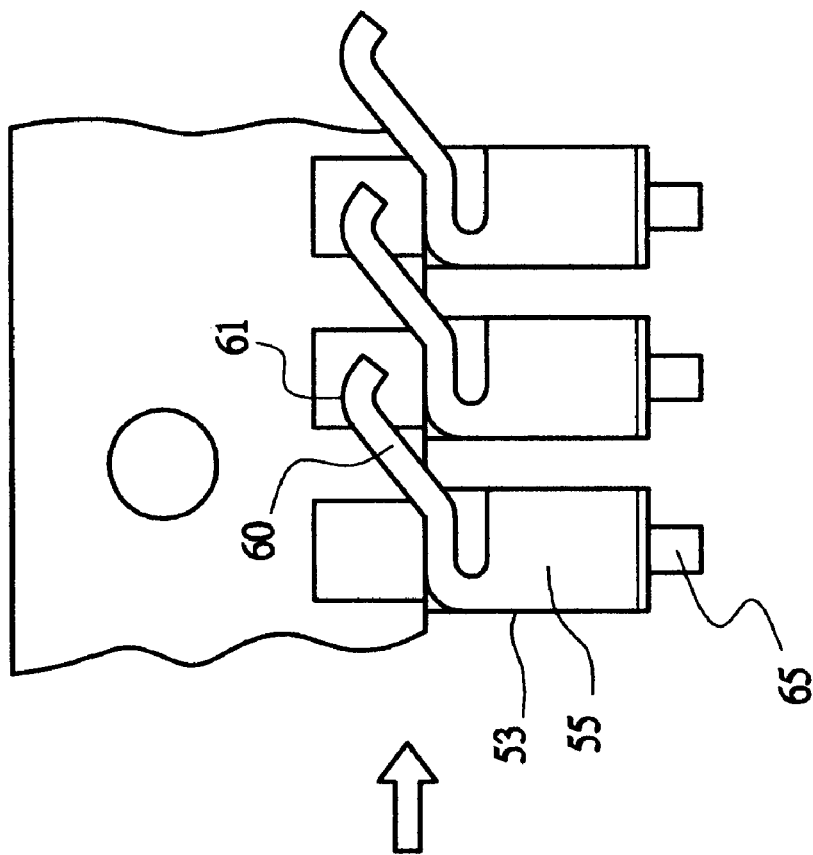
FIG. 9 is a schematic plane view showing manufacturing of the terminals according to the first embodiment of the invention.
Figure 9:
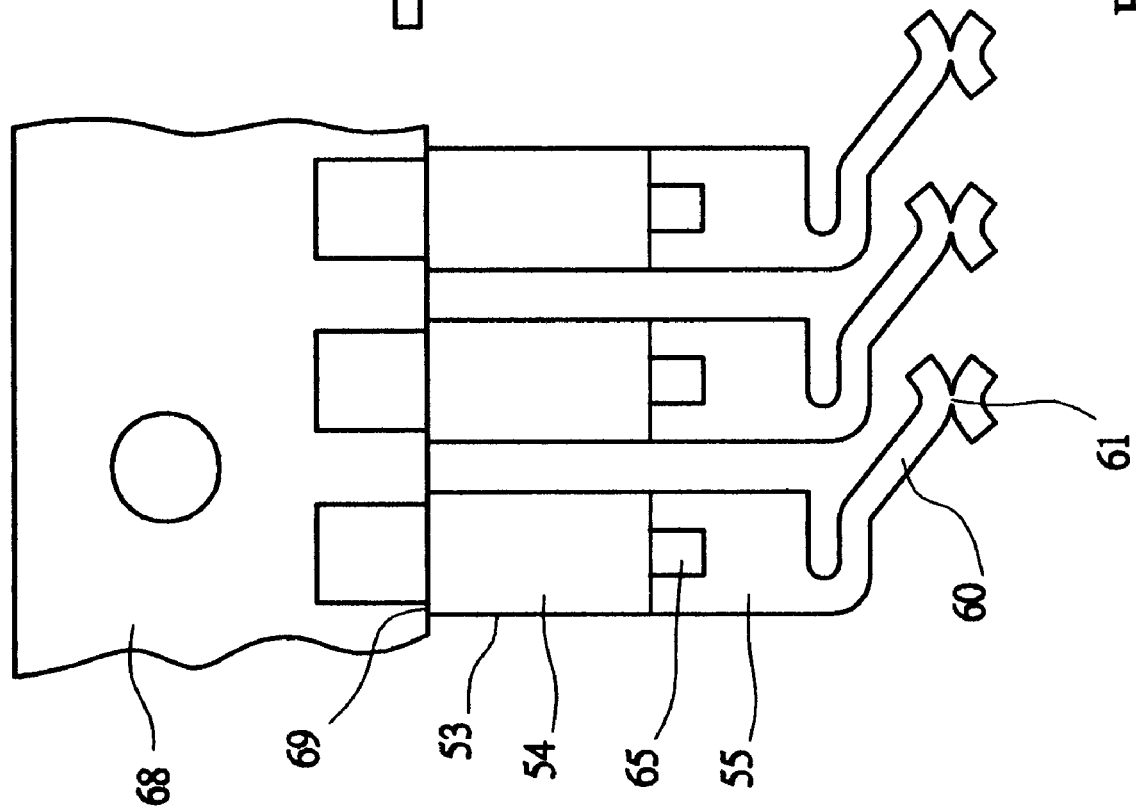

As shown in FIG. 9, a metal plate is pressed to form the continuous terminals 50 connected to a material tape 68. Gaps between the terminals 50 are the same as gaps between the terminal slots 41. The terminal 50 has a cut surface 51 and a plate surface 52. The terminal 50 includes a fixing portion 53, an elastic arm 60 and a pin portion 65. The fixing portion 53 has a plate surface close to the first wall 44 of the terminal slot 41 for positioning. The fixing portion 53 includes a first plate 54 and a second plate 55, which are folded back to contact each other. Bottom ends of the two plates 54 and 55 are connected to each other and the plate surfaces of the plates 54 and 55 face each other. Two sides of a top end of the first plate 54 are connected to the material tape 68 and the top end of the first plate 54 has a folding mark 69. The elastic arm 60 is connected to a top end of the second plate 55 of the fixing portion and has a plate surface, which extends longitudinally and slantingly upwards in a direction toward one side of the fixing portion 53 and extends across the second wall 45 to a location above the neighboring terminal slot. A connection point 61 near a distal end of the elastic arm 60 is formed. The connection point 61 is formed by folding two plate surfaces together so that the connection point 61 has an circular arc surface but not the cut surface and has the thickness of two material plates. The pin portion 65 is prodded and pressed from the plate surface of the second plate 55 of the fixing portion, and the top end of the pin portion 65 is connected to the bottom end of the first plate 54. The pin portion 65 extends downwards to the bottom end of the base, and is bent to engage with a solder ball 67. The terminals 50 are assembled with the terminal slots 41 of the internal seat 40 of the base from top to bottom and then broken from the folding marks 69 so that the terminals 50 are separated from the material tape 68.

The upper cover 70 has a covering surface 71 and two sidewalls 72. Two sides of the rear end of the upper cover 70 are formed with arced pivoting portions 73. The middle of the rear end of the upper cover 70 is formed with a stopping piece 74. The pivoting portion 73 is pivotally connected to the second pivoting portion 35 of the rear end of the external seat 30 of the base. The front end of the upper cover 70 is formed with two transversal tabs 75 extending forwards. When the upper cover 70 covers the base, the covering surface 71 can press down the circumference of the chip 90. In addition, when the upper cover 70 is lifted up to a longitudinal state, the stopping piece 74 can stop at the rear end of the external seat 30 so that the upper cover 70 cannot fall out.

Figures 1, 2:
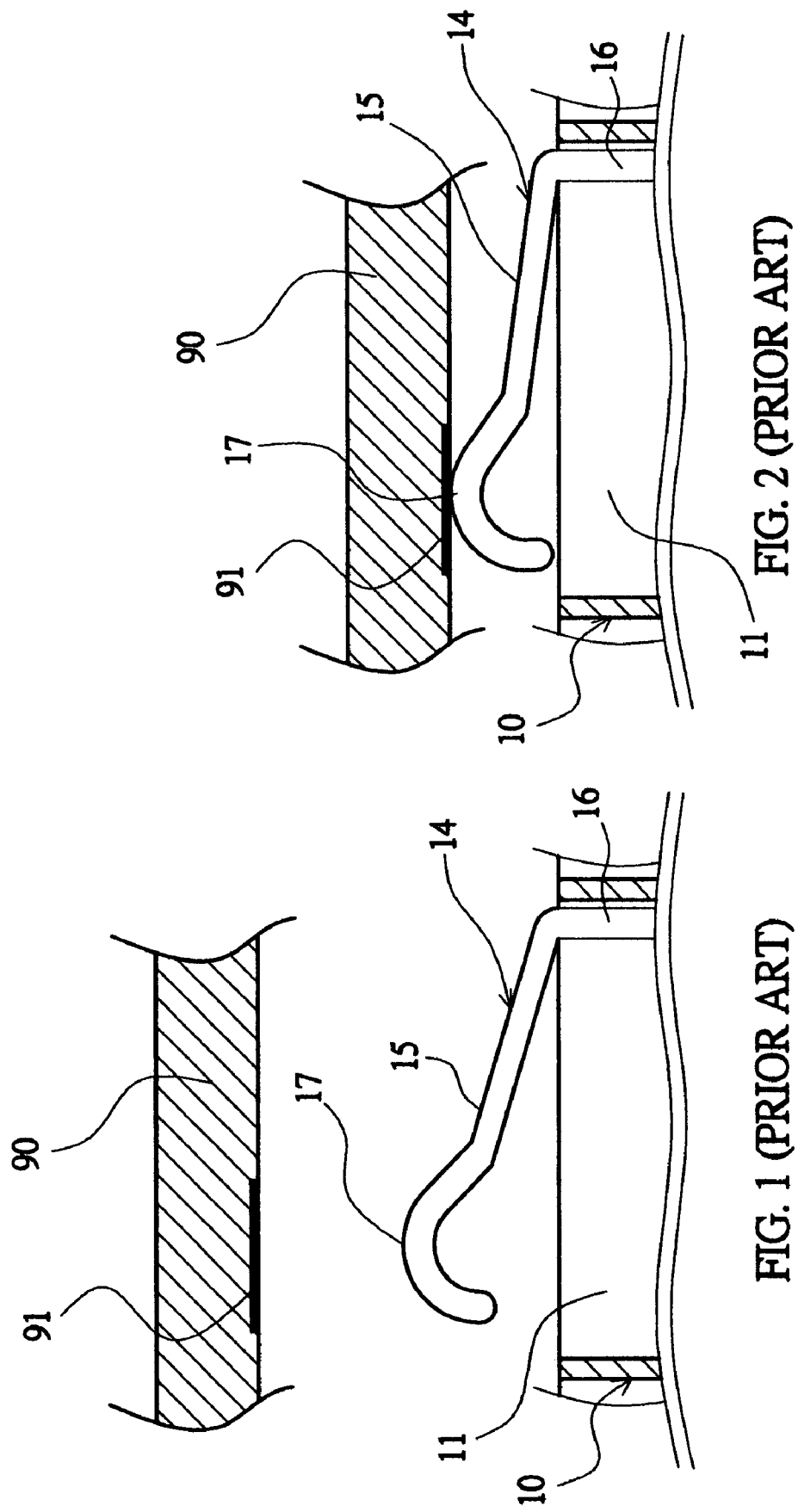
FIG. 1 shows a first used state of a conventional electrical connector and a chip.
FIG. 2 shows a second used state of the conventional electrical connector and the chip.
Figure 3:
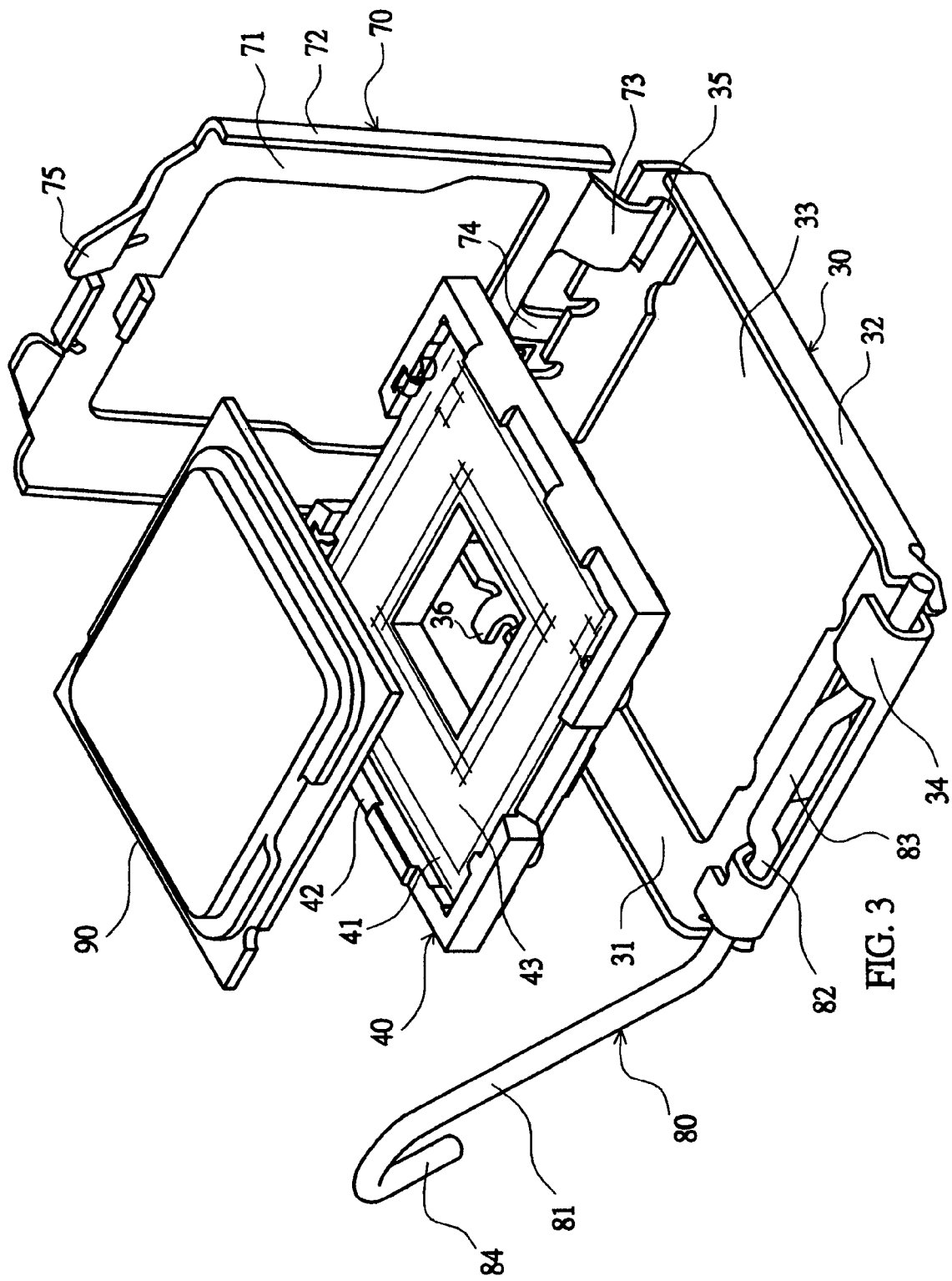
FIG. 3 is a pictorially exploded view showing an electrical connector according to a first embodiment of the invention.
Figure 4:
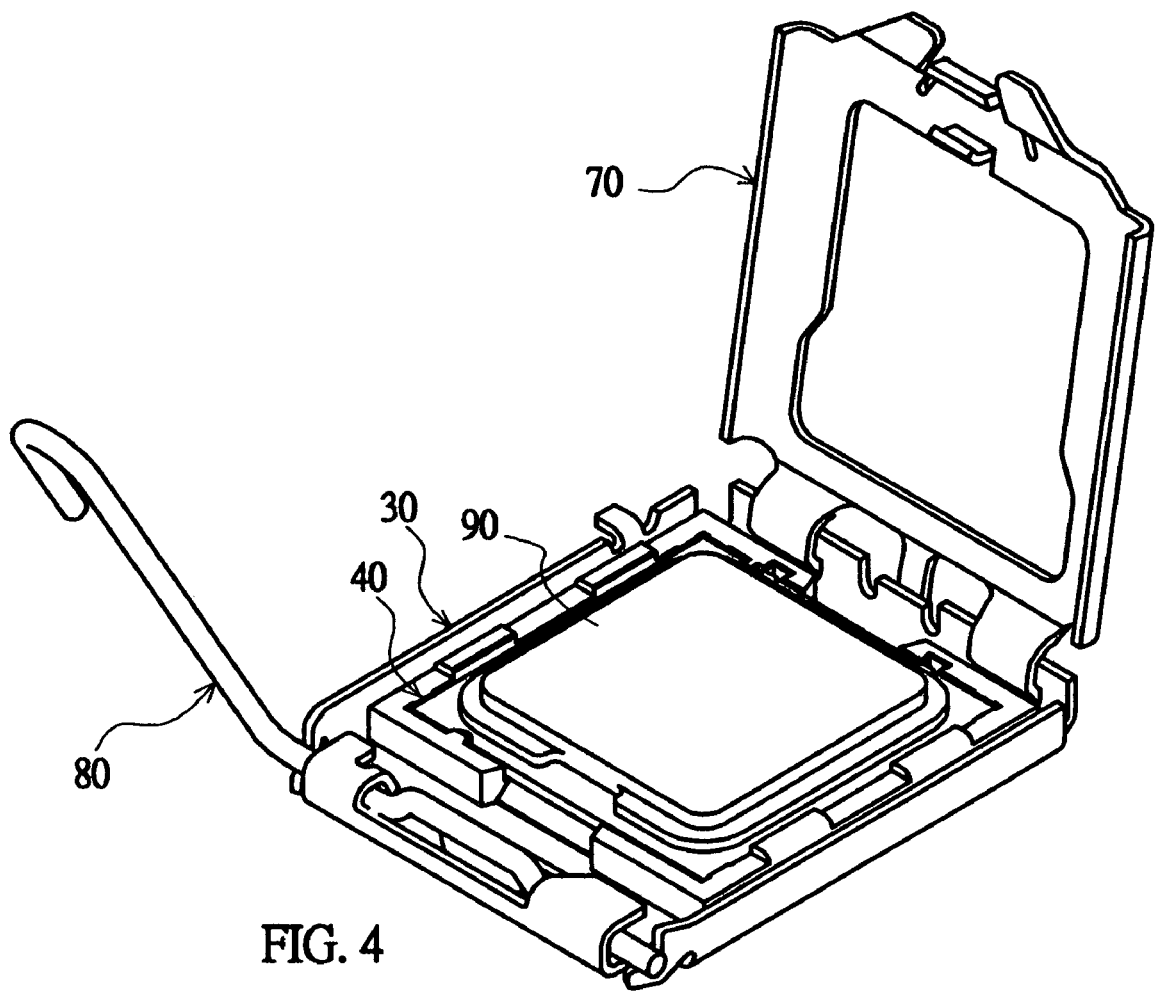
FIG. 4 is a pictorially assembled view showing the electrical connector according to the first embodiment of the invention.
Figure 5:
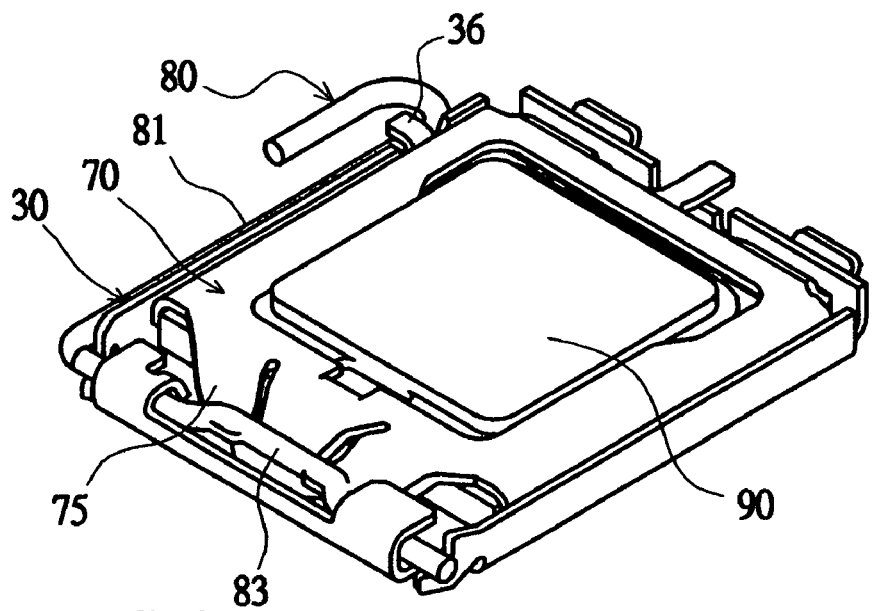
FIG. 5 is a pictorial view showing a used state of the connector according to the first embodiment of the invention.

The lever 80 includes a first rod 81 and a second rod 82 perpendicular to each other. The second rod 82 is pivotally connected to the first pivoting portion 34 of the front end of the external seat 30 of the base, and is bent to form a convex section 83. The external end of the first rod 81 is bent to form a handle 84. When the first rod 81 is rocked toward the rear end of the base, the convex section 83 can press the tab 75 of the upper cover 70 to cause the upper cover 70 to press down the chip 90. As shown in FIG. 5, when the lever 80 is rocked to a positioning location, the first rod 81 can engage with and located below the engaging piece 36 of the external seat 30.

Figure 10:
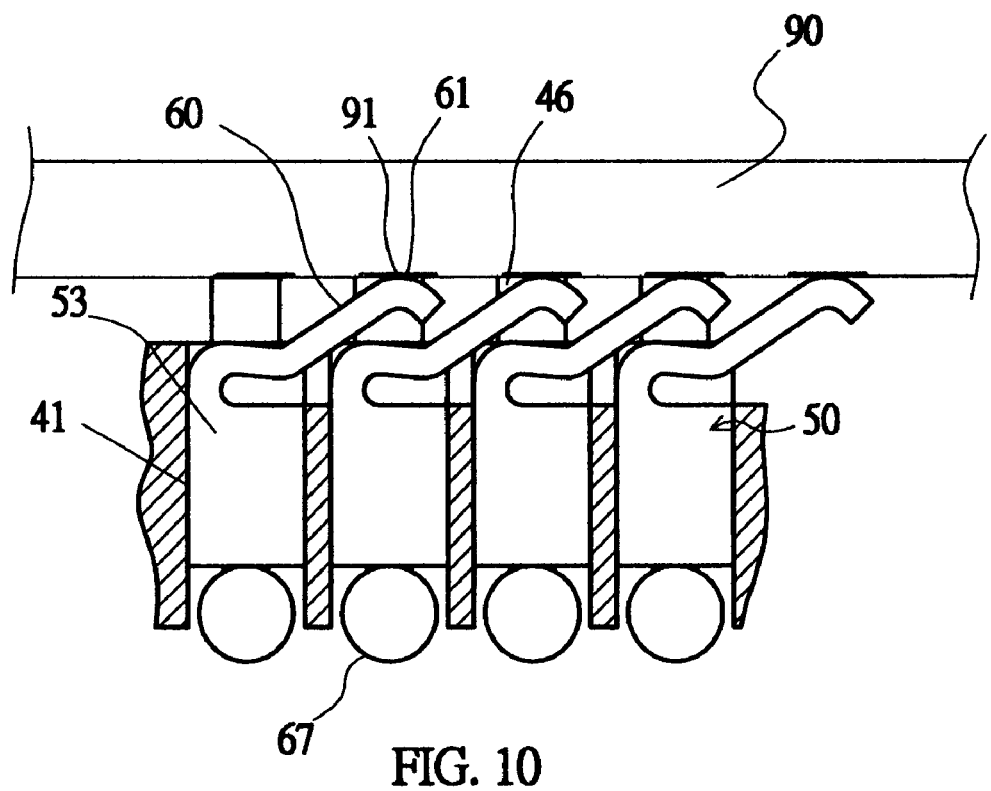
FIG. 10 is a schematic illustration showing the used state of the connector according to the first embodiment of the invention.

According to the above-mentioned structure, the elastic arm 60 has the excellent elasticity because the elastic arm 60 of the terminal 50 extends to the neighboring terminal slot 41. As shown in FIG. 10, when the chip 90 is pressed by the upper cover to contact the terminal 50, the elastic arm 60 of the terminal is moved elastically, and the connection point 61 can be in elastic contact with the connection point 91 of the chip 90. The elastic arm 60 of the terminal extends slantingly upwards and thus cannot touch the neighboring terminal slot 41 to cause the short-circuited condition. Furthermore, the plate surface of the elastic arm extends longitudinally and slantingly upwards in a direction toward one side of the fixing portion 53, so the length of the terminal slot 41 can be decreased to facilitate the spatial arrangement and more terminal slots can be formed. In addition, the elastic arm 60 of the terminal is formed by way of pressing but not bending, the dimension can be easily controlled and the arm 60 can be easily manufactured.

The invention has the following advantages.

1. The elastic arm 60 of the terminal 50 extends to the neighboring terminal slot 41, so the elastic arm 60 has the excellent elasticity.

2. The plate surface of the elastic arm of the terminal 50 extends longitudinally and slantingly upwards in a direction toward one side of the fixing portion 53, so the length of the terminal slot 41 can be decreased to facilitate the spatial arrangement and more terminal slots can be formed. In addition, the terminals can be manufactured more easily.

3. The fixing portion 53 of the terminal 50 has the first plate 54 and the second plate 55, which are folded together. Thus, the material tape 68 can be connected to the top end of the first plate 54 of the fixing portion 53. Thus, the terminals are assembled within the terminal slots 41 of the internal seat 40 of the base from top to bottom, and are then broken from the folding mark 69 so that the terminals are separated from the material tape 68 and the assembling process can be conveniently carried out.

Figure 11:
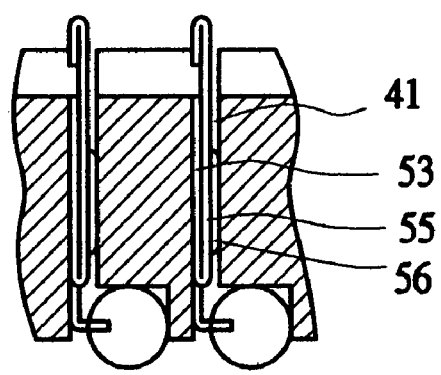
FIG. 11 is a lateral cross-sectional assembled view showing terminals and an internal seat according to a second embodiment of the invention.

As shown in FIG. 11, the second embodiment of the invention is almost the same as the first embodiment except that the plate surface of the second plate 55 of the fixing portion 53 of the terminal 50 is pressed to form a rib 56 for pushing against the terminal slot 41 so that no step has to be formed in the terminal slot 41 of this embodiment.

Figure 12:
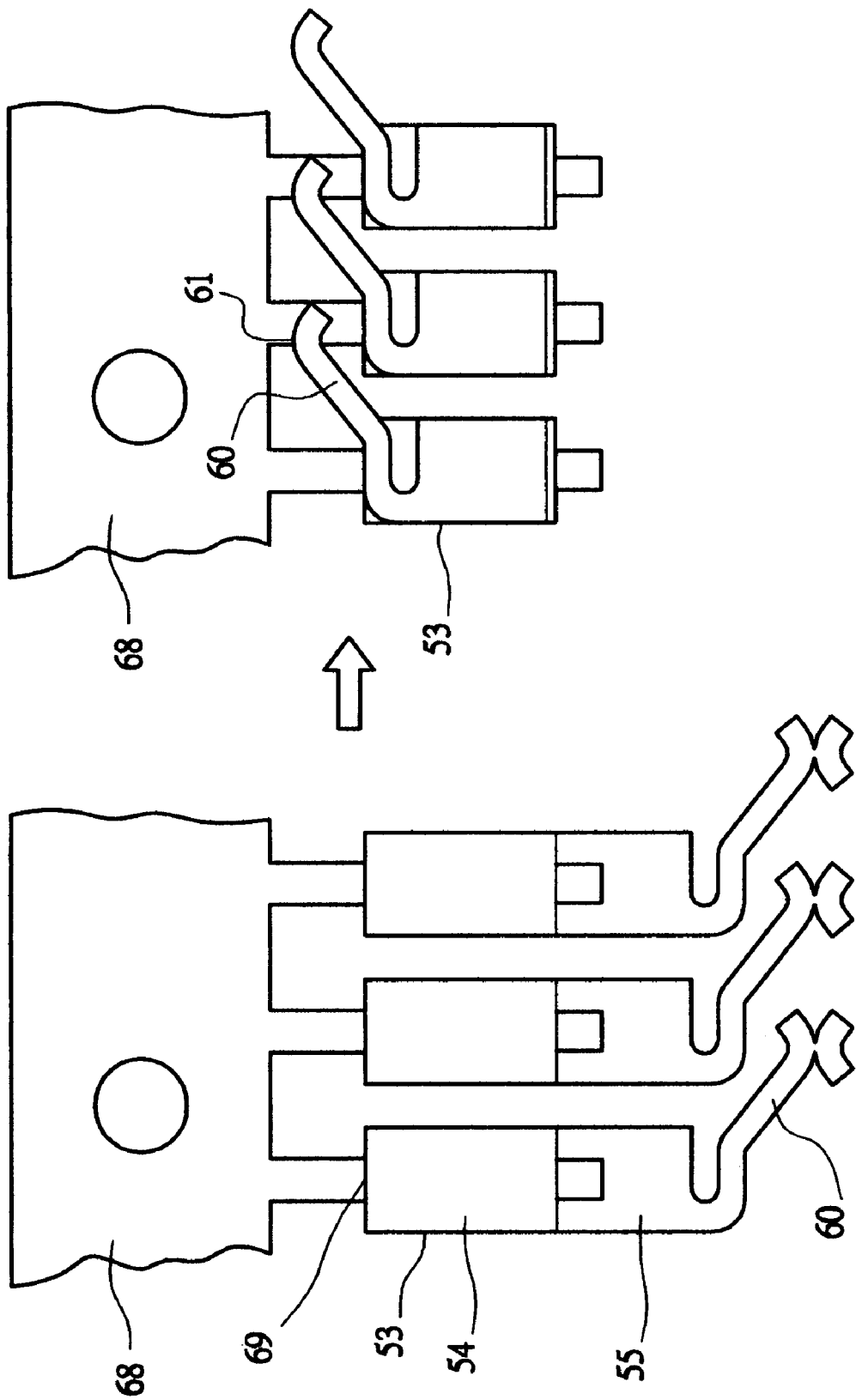
FIG. 12 is a schematic plane view showing manufacturing of terminals according to a third embodiment of the invention.

As shown in FIG. 12, the third embodiment of the invention is almost the same as the first embodiment except that the middle of the top end of the first plate 54 of the fixing portion of the terminal 50 is connected to the material tape 68 and is formed with the folding mark 69.

As shown in FIGS. 13 and 14, the fourth embodiment of the invention is almost the same as the first embodiment except that an arc portion 62 extending longitudinally is formed near a connection portion between the elastic arm 60 of the terminal 50 and the fixing portion 53, and a rib 63 is formed near the connection point 61. Thus, when the terminal slots are denser such that the lateral lengths thereof are shorter, the good elasticity can be obtained according to the longitudinally extended arc portion 62. In addition, the rib 63 provides the greater thickness near the connection point so that the projection 46 of the internal seat 40 can indeed position the connection point 61 of the terminal to prevent the terminal from shaking leftwards and rightwards so that the electrical contact is correct and stable.

Figure 16:
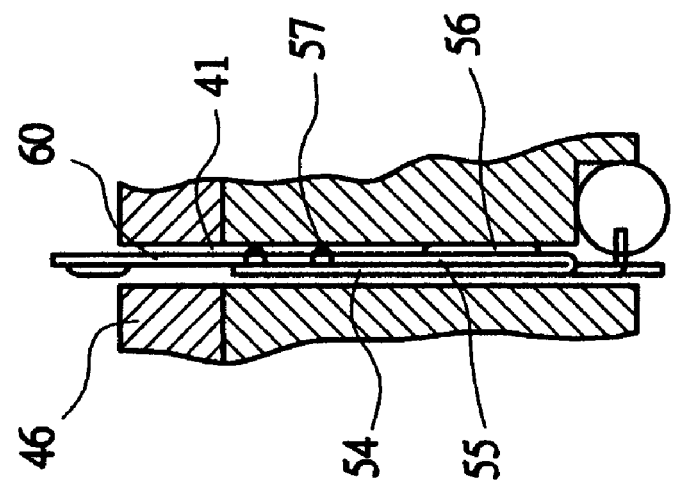
FIG. 16 is a lateral cross-sectional assembled view showing the terminals and the internal seat according to the fifth embodiment of the invention.
Figure 15:
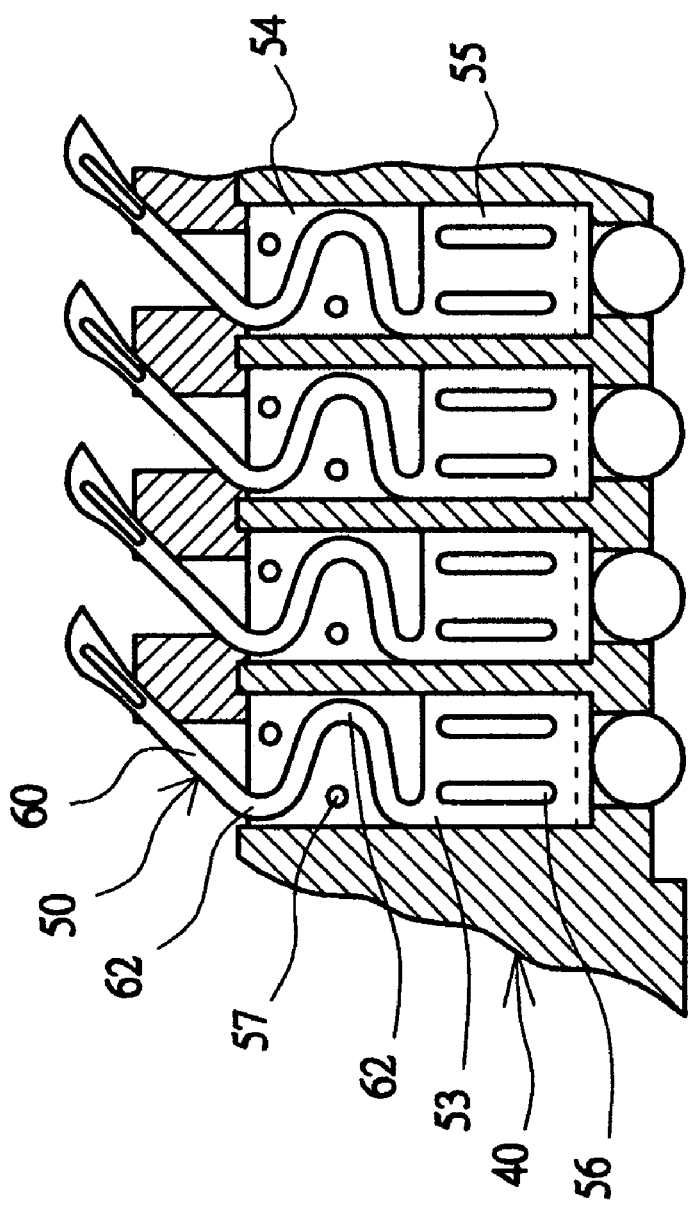
FIG. 15 is a front cross-sectional assembled view showing terminals and an internal seat according to a fifth embodiment of the invention.

As shown in FIGS. 15 and 16, the fifth embodiment of the invention is almost the same as the fourth embodiment except that two arc portions 62 extending longitudinally are formed near a connection portion between the elastic arm 60 of the terminal 50 and the fixing portion 53, and the plate surface of the first plate 54 of the fixing portion is pressed to form an embossed circle 57. The plate surface of the second plate 55 is pressed to form the rib 56 so that a gap for the movable elastic arm 60 of the terminal can be left after the terminal is assembled with the terminal slot 41.

Figure 17:
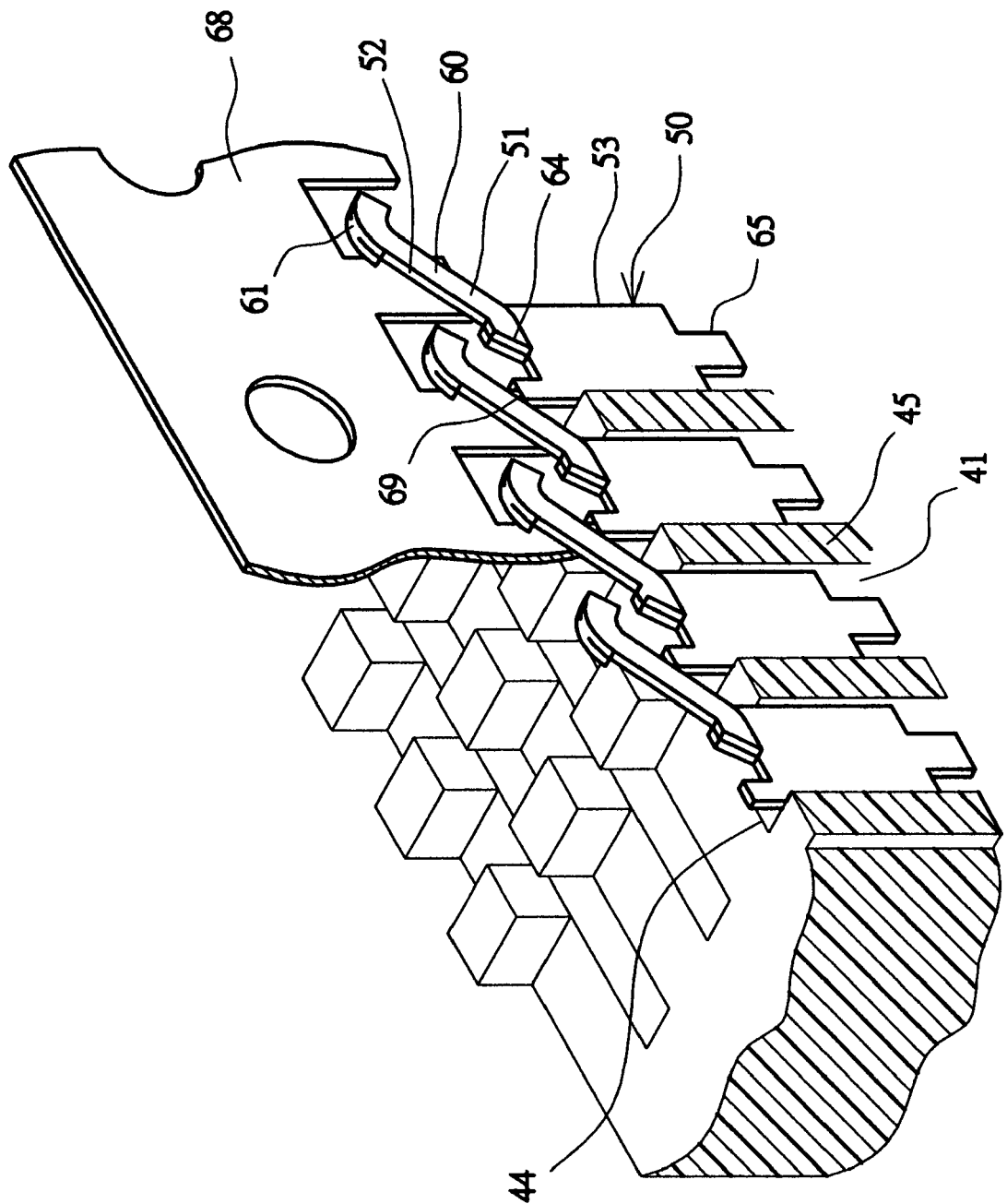
FIG. 17 is a pictorially assembled view showing terminals and an internal seat according to a sixth embodiment of the invention.
Figure 18:
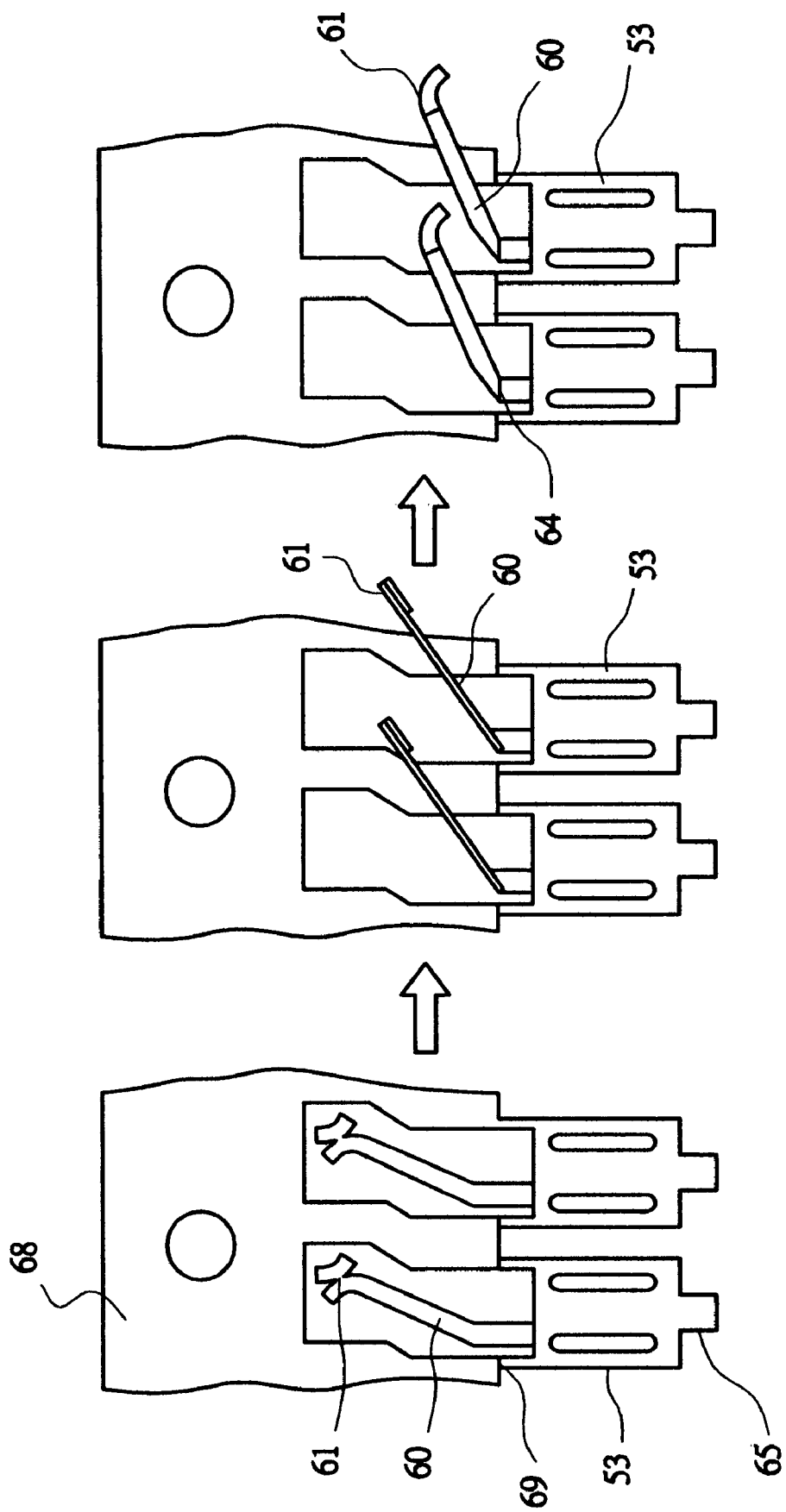
FIG. 18 is a schematic plane view showing manufacturing of the terminals according to the sixth embodiment of the invention.

As shown in FIGS. 17 and 18, the sixth embodiment of the invention is almost the same as the first embodiment except for the terminals 50. The terminals 50 are formed by pressing a metal plate so that the material tape 68 and the continuous terminals connected to the material tape 68 are formed. The terminal 50 has a cut surface 51 and a plate surface 52. The terminal 50 includes a fixing portion 53, an elastic arm 60 and a pin portion 65. The fixing portion 53 has a plate surface close to the first wall 44 of the terminal slot 41 for positioning, and a top end having two sides connected to the material tape 68 and formed with a folding mark 69. The elastic arm 60 is connected to the top end of the fixing portion 53 and is formed with a folding portion 64, which forms an angle of 38 to 53 degrees (the angle of 45 degrees is preferred) with respect to a horizontal level, near a connection portion between the fixing portion and the elastic arm 60. Thus, the plate surface of the elastic arm 60 extends longitudinally and slantingly upwards in a direction toward one side of the fixing portion 53 and across the second wall 45 to a location above the neighboring terminal slot. A connection point 61 of the elastic arm 60 is formed near a distal end of the elastic arm 60. The connection point 61 is formed by folding two plate surfaces so that the connection point 61 has a circular arc surface but does not have a cut surface and provides the thickness of two material plates. The pin portion 65 is connected to the bottom end of the fixing portion 53 and extends downwards to the bottom end of the base. The terminals 50 are assembled within the terminal slots 41 of the internal seat 40 of the base from top to bottom, and are then broken from the folding mark 69 so that the terminals 50 are separated from the material tape 68.

As shown in FIG. 18, when the material is pressed to form the terminals, which are not bent (i.e., the terminal is developed to a plane state), the elastic arm 60 extends longitudinally without interfering with the material tape 68 connected to the top end of the fixing portion 53, as shown in the left portion of the drawing. Next, the elastic arm 60 is bent, by 90 degrees, slantingly upward (about 45 degrees with respect to the horizontal level) at a location close to the connection portion between the fixing portion and the elastic arm, as shown in the middle portion of the drawing. Finally, the elastic arm 60 is bent by 90 degrees to form the folding portion 64, as shown in the right portion of the drawing.

In the terminal 50 of this embodiment, the folding portion 64 is provided so that the developed elastic arm 60 cannot interfere with the material tape 68 connected to the top end of the fixing portion 53. Thus, the material of the fixing portion 53 can be saved, and it is unnecessary to provide the folded first and second plates.

Figures 19, 20:
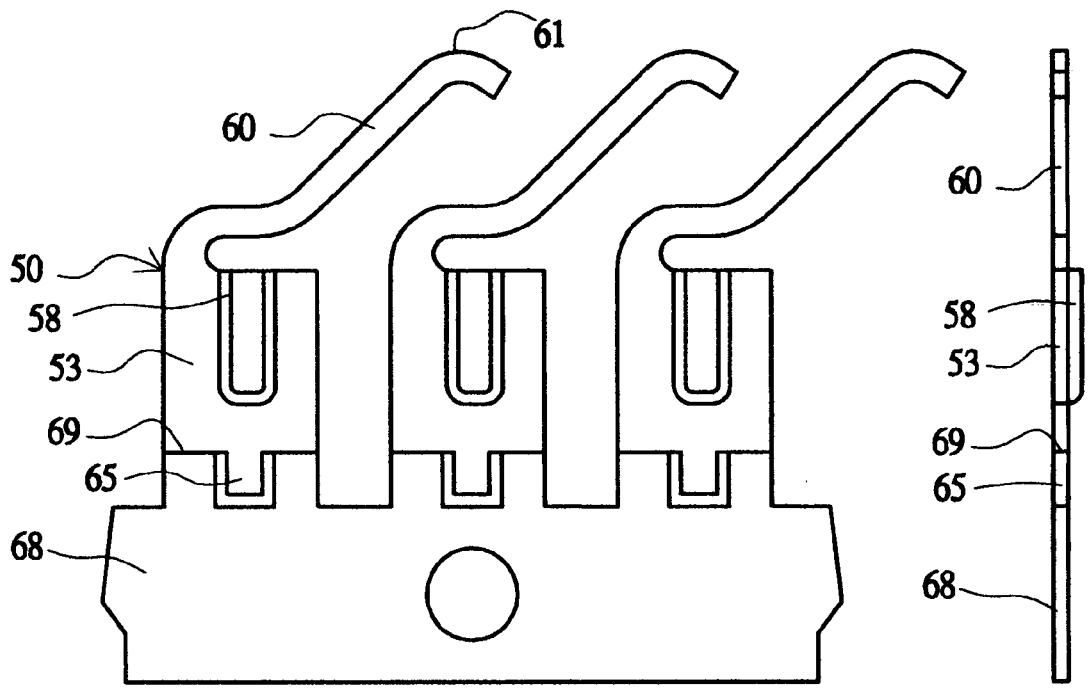
FIG. 19 is a front view showing terminals according to a seventh embodiment of the invention.
FIG. 20 is a side view showing the terminals according to the seventh embodiment of the invention.

As shown in FIGS. 19 and 20, the seventh embodiment of the invention is almost the same as the first embodiment except for the terminals 50. The terminals 50 are formed by pressing a metal plate so that the material tape 68 and the continuous terminals connected to the material tape 68 are formed. The terminal 50 includes a fixing portion 53, an elastic arm 60 and a pin portion 65. The fixing portion 53 has a bottom end, which has two sides connected to the material tape 68 and is formed with a folding mark 69. The middle of the plate surface of the fixing portion 53 is pressed to form a pressing block 58. The elastic arm 60 is connected to the top end of the fixing portion 53 and has a plate surface, which extends longitudinally and slantingly upwards in a direction toward one side of the fixing portion 53 and extends to the location above the neighboring terminal 50. A connection point 61 of the elastic arm 60 is formed near a distal end thereof. The pin portion 65 is connected to the bottom end of the fixing portion 53. The terminals 50 are clamped by a pressing jig and are then broken from the folding mark 69 so that the terminals 50 are separated from the material tape 68. Then, the pressing jig presses the pressing block 58 of each terminal so that the terminals are assembled within the terminal slots of the internal seat of the base from top to bottom, respectively.

The pressing jig is well known in the art, so detailed descriptions thereof will be omitted.

Figures 21, 22:
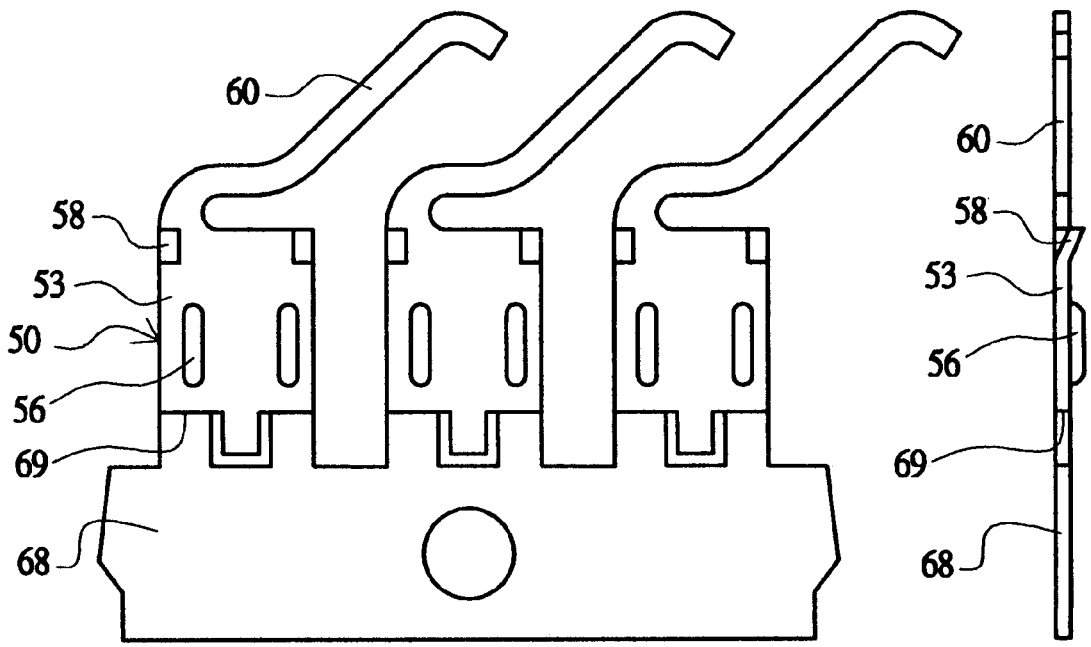
FIG. 21 is a front view showing terminals according to an eighth embodiment of the invention.
FIG. 22 is a side view showing the terminals according to the eighth embodiment of the invention.

As shown in FIGS. 21 and 22, the eighth embodiment of the invention is almost the same as the seventh embodiment except that two sides of the top end of the fixing portion 53 of the terminal 50 are pressed to form pressing blocks 58 projecting from the plate surface. In addition, the plate surface is pressed to form a projecting rib 56.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. An electrical connector, comprising:
   a base formed with a plurality of terminal slots each having two opposite first walls and two opposite second walls; and
   a plurality of terminals formed by pressing a metal plate to form a material tape and the terminals, which are continuous terminals and connected to the material tape, wherein each of the terminals is assembled within a corresponding one of the terminal slots of the base and then separated from the material tape, each of the terminals has a cut surface and a plate surface and comprises a fixing portion, an elastic arm and a pin portion, the fixing portion has a plate surface close to the first wall of the terminal slot for positioning, the elastic arm is connected to the fixing portion and has a plate surface, which extends longitudinally and slantingly upwards in a direction toward one side of the fixing portion and extends across the second wall to a location above a neighboring one of the terminal slots adjacent to the terminal slot, a connection point near a distal end of the elastic arm is formed, and the pin portion is disposed below the fixing portion and extends downwards to a bottom end of the base.

2. The connector according to claim 1, wherein the connection point of the elastic arm of the terminal is formed by folding the plate surfaces together so that the connection point has a circular arc surface but not a cut surface.

3. The connector according to claim 1, wherein at least one arc portion extending longitudinally is formed near a connection portion between the elastic arm of the terminal and the fixing portion of the terminal.

4. The connector according to claim 1, wherein:
   a top end of the fixing portion is connected to the material tape and is formed with a folding mark;
   the pin portion is connected to a bottom end of the fixing portion;
   the elastic arm of the terminal is formed with a folding portion, which forms an angle of 38 to 53 degrees with respect to a horizontal level, near a connection portion between the fixing portion and the elastic arm so that the elastic arm extends in the direction toward the one side of the fixing portion; and
   the elastic arm extends longitudinally without interfering with the material tape connected to the top end of the fixing portion when the terminal is developed.

5. The connector according to claim 1, wherein the fixing portion of the terminal is formed with a pressing block projecting from the plate surface of the fixing portion, a bottom end of the fixing portion is connected to the material tape and is formed with a folding mark, and the pin portion is connected to the bottom end of the fixing portion.

6. The connector according to claim 1, wherein the plate surface of the fixing portion of the terminal is formed with a rib.

7. The connector according to claim 1, wherein the pin portion of the terminal is connected to a solder ball.

8. The connector according to claim 1, wherein gaps between the terminals connected to the material tape are the same as gaps between the terminal slots, and the terminals are assembled with the terminal slots from top to bottom, respectively.

9. The connector according to claim 1, wherein the first wall of the base is formed with a projection disposed near the elastic arm of the terminal, and the projection is lower than the connection point of the terminal.

10. The connector according to claim 9, wherein a rib of the terminal is formed near the connection point of the elastic arm to provide a greater thickness near the connection point.

11. The connector according to claim 1, wherein the fixing portion of the terminal has a first plate and a second plate, both of which have bottom ends connected to each other and plate surfaces facing each other, a top end of the first plate is connected to the material tape and has a folding mark, and a top end of the second plate is connected to the elastic arm.

12. The connector according to claim 11, wherein the pin portion of the terminal is prodded and pressed from the plate surface of the first plate of the fixing portion.

13. The connector according to claim 11, wherein the plate surface of the second plate of the fixing portion of the terminal is formed with a rib.

14. The connector according to claim 1, wherein a top end of the base has a placement area in which a chip is placed, the connection points of the terminals project from the terminal slots to the placement area, and the electrical connector further comprises:
   an upper cover having a rear end pivotally connected to a rear end of the base, and a front end formed with a tab extending transversally and forwards, wherein the upper cover presses down the chip when the upper cover covers the base; and
   a lever having a first rod and a second rod perpendicular to each other, wherein the second rod is pivotally connected to the front end of he base and is bent to form a convex section, and the convex section presses the tab of the upper cover when the first rod is rocked toward the rear end of the base.

15. The connector according to claim 14, wherein the base comprises a metallic external seat and a plastic internal seat, the internal seat is fit within the external seat, the terminal slots and the placement area are formed on the internal seat, and the lever and the upper cover are pivotally connected to a front end and a rear end of the external seat, respectively.

* * * * *